(12) United States Patent
Shibasaki et al.

(10) Patent No.: US 10,836,000 B2
(45) Date of Patent: Nov. 17, 2020

(54) FLUX, SOLDER PASTE, AND METHOD FOR FORMING SOLDER BUMP

(71) Applicant: TAMURA CORPORATION, Tokyo (JP)

(72) Inventors: Masanori Shibasaki, Iruma (JP); Jun Sugimoto, Iruma (JP); Isao Sakamoto, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 37 days.

(21) Appl. No.: 16/137,476

(22) Filed: Sep. 20, 2018

(65) Prior Publication Data

US 2019/0084097 A1    Mar. 21, 2019

(30) Foreign Application Priority Data

Sep. 21, 2017  (JP) ................................. 2017-181824
Sep. 10, 2018  (JP) ................................. 2018-169221

(51) Int. Cl.
  *B23K 35/362*   (2006.01)
  *H01L 23/00*    (2006.01)
  *H05K 3/40*     (2006.01)

(52) U.S. Cl.
  CPC .......... *B23K 35/362* (2013.01); *H01L 24/11* (2013.01); *H05K 3/4007* (2013.01); *H01L 24/13* (2013.01); *H01L 2224/1131* (2013.01); *H01L 2224/1132* (2013.01); *H01L 2224/1147* (2013.01); *H01L 2224/1181* (2013.01); *H01L 2224/11332* (2013.01); *H01L 2224/11849* (2013.01); *H01L 2224/1329* (2013.01); *H01L 2224/13109* (2013.01); *H01L 2224/13116* (2013.01); *H01L 2224/13139* (2013.01); *H01L 2224/13147* (2013.01); *H01L 2224/13294* (2013.01); *H01L 2224/13311* (2013.01); *H01L 2924/014* (2013.01); *H05K 2203/043* (2013.01); *H05K 2203/0425* (2013.01)

(58) Field of Classification Search
  CPC .............................. B23K 35/362; H01L 24/11
  USPC ............................................................ 148/23
  See application file for complete search history.

(56) References Cited

U.S. PATENT DOCUMENTS

2005/0203575 A1* 9/2005  Carson ............. A61M 37/0015
                                                        606/204.35

FOREIGN PATENT DOCUMENTS

| JP | 63-281794 | 11/1988 |
|---|---|---|
| JP | 63281794 A * | 11/1988 |
| JP | 08-019891 | 1/1996 |
| JP | 2007-44740 | 2/2007 |
| JP | WO2012/173059 | 12/2012 |

OTHER PUBLICATIONS

Japanese Office Action for corresponding JP Application No. 2018-169221, dated Oct. 23, 2019 (w/ machine translation).
Japanese Office Action for corresponding JP Application No. 2018-169221, dated May 26, 2020 (w/ machine translation).

* cited by examiner

*Primary Examiner* — Weiping Zhu
(74) *Attorney, Agent, or Firm* — Mori & Ward, LLP

(57) ABSTRACT

A flux includes a rosin resin, an activator, a thixotropic agent, and a solvent. The solvent includes 30% by mass or more and 60% by mass or less monovalent alcohol with respect to a total mass amount of the flux. The monovalent alcohol has 18 or more and 24 or less of carbon atoms in one molecule.

20 Claims, 2 Drawing Sheets

FLUX, SOLDER PASTE, AND METHOD FOR FORMING SOLDER BUMP

CROSS-REFERENCE TO RELATED APPLICATIONS

The present applications claims priority under 35 U.S.C. § 119 to Japanese Patent Application No. 2017-181824, filed Sep. 21, 2017 and Japanese Patent Application No. 2018-169221, filed Sep. 10, 2018. The contents of these applications are incorporated herein by reference in their entirety.

BACKGROUND

Field of the Invention

The present invention relates to a flux, a solder paste, and a method for forming a solder bump.

Discussion of the Background

When electric components are joined to an electric circuit formed on a substrate such as a printed circuit board or a silicon wafer, a solder alloy is used as the joining material. Examples of the joining using the solder alloy include a method of printing a solder paste composed of a solder alloy powder and a flux on a substrate, and a method of joining using solder bumps of a solder alloy formed on a substrate. The solder paste may be used for forming the solder bumps.

Common fluxes used in solder pastes are mainly comprised of a resin such as a rosin, and made by melting an activator and a thixotropic agent in a solvent. However, a solder paste using a prior art flux can cause voids in solder joints formed during reflowing after printing the solder paste on electrodes. These voids decrease joining properties and heat dissipation between the joint and the part to be joined such as a substrate and electronic components, and can decrease reliability of electronic devices and semiconductors.

In recent years, as a method for forming solder bumps using a solder paste, a dry film process is used. According to the process, firstly, a dry film is attached to a substrate having a certain electronic circuit or a certain electronic circuit and an insulating layer formed thereon, and the object is subjected to exposure and development according to a certain pattern. As a result of this, the portion of the resist component where solder bumps are to be formed (on the electrodes) on the dry film is removed, a dry film layer having a certain pattern is formed on the substrate, and a region (opening) surrounded by the dry film layer is formed. Subsequently, printing is carried out in such a manner that the solder paste is charged into the opening, and the object is reflowed as it is, thereby forming solder bumps. Furthermore, the dry film layer and the flux residue formed near the solder bumps are removed.

When solder bumps are formed using the dry film process, in comparison with other bump formation methods, a phenomenon of easy void occurrence in solder bumps and a phenomenon of missing bumps which is the loss of solder bumps from the substrate during removal of the flux residue, tend to occur.

The voids in solder bumps are likely caused by the flux component which has not been discharged after being taken into the molten solder alloy during reflowing. The cause of the missing bumps is also considered as follows: the molten solder alloy does not thoroughly spread to the bottom of the opening because of the decrease in flowability of the flux during reflowing, and the flux remains on the bottom to become a residue. These are caused by the increase in the viscosity of the flux and the decrease in flowability of the flux because of the vaporization of the solvent contained in the flux during reflowing.

When solder bumps are formed by the dry film method, the film thickness of the dry film layer forming the opening tends to be greater than the masks used in other methods. Therefore, in this case, the height from the surface of the dry film layer to the bottom of the opening (depth of the opening) increases, which hinders spread of the molten solder alloy to the bottom of the opening, and the flux easily accumulates on the bottom, which likely promotes the occurrence of missing bumps.

As a method for suppressing the occurrence of missing bumps, for example, disclosed is a solder paste which has a viscosity allowing feeding into an opening under a reduced pressure and charging into the opening at an atmospheric pressure, and includes a solvent for adjusting the viscosity and thixotropic ratio and having a boiling point of 240° C. or higher (see International Publication WO 2012/173059 A).

SUMMARY OF THE INVENTION

According to a first aspect of the present invention, a flux includes a rosin resin, an activator, a thixotropic agent, and a solvent. The solvent includes 30% by mass or more and 60% by mass or less monovalent alcohol with respect to a total mass amount of the flux. The monovalent alcohol has 18 or more and 24 or less of carbon atoms in one molecule.

According to a second aspect of the present invention, a solder paste includes a solder alloy powder and a flux. The flux includes, a rosin resin, an activator, a thixotropic agent, and a solvent. The solvent includes 30% by mass or more and 60% by mass or less monovalent alcohol with respect to a total mass amount of the flux. The monovalent alcohol has 18 or more and 24 or less of carbon atoms in one molecule.

According to a third aspect of the present invention, a method for forming a solder bump, includes providing an electrode and a first insulating layer on a substrate, providing a second insulating layer on the first insulating layer such that an opening is provided on the electrode, filling the opening with a solder paste including a solder alloy powder and a flux, the flux including a rosin resin, an activator, a thixotropic agent, and a solvent, the solvent including 30% by mass or more and 60% by mass or less monovalent alcohol with respect to a total mass amount of the flux, the monovalent alcohol having 18 or more and 24 or less of carbon atoms in one molecule, heating the substrate to form a flux residue after the opening is filled with the solder paste, and removing the flux residue and the second insulating layer to form the solder bump.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
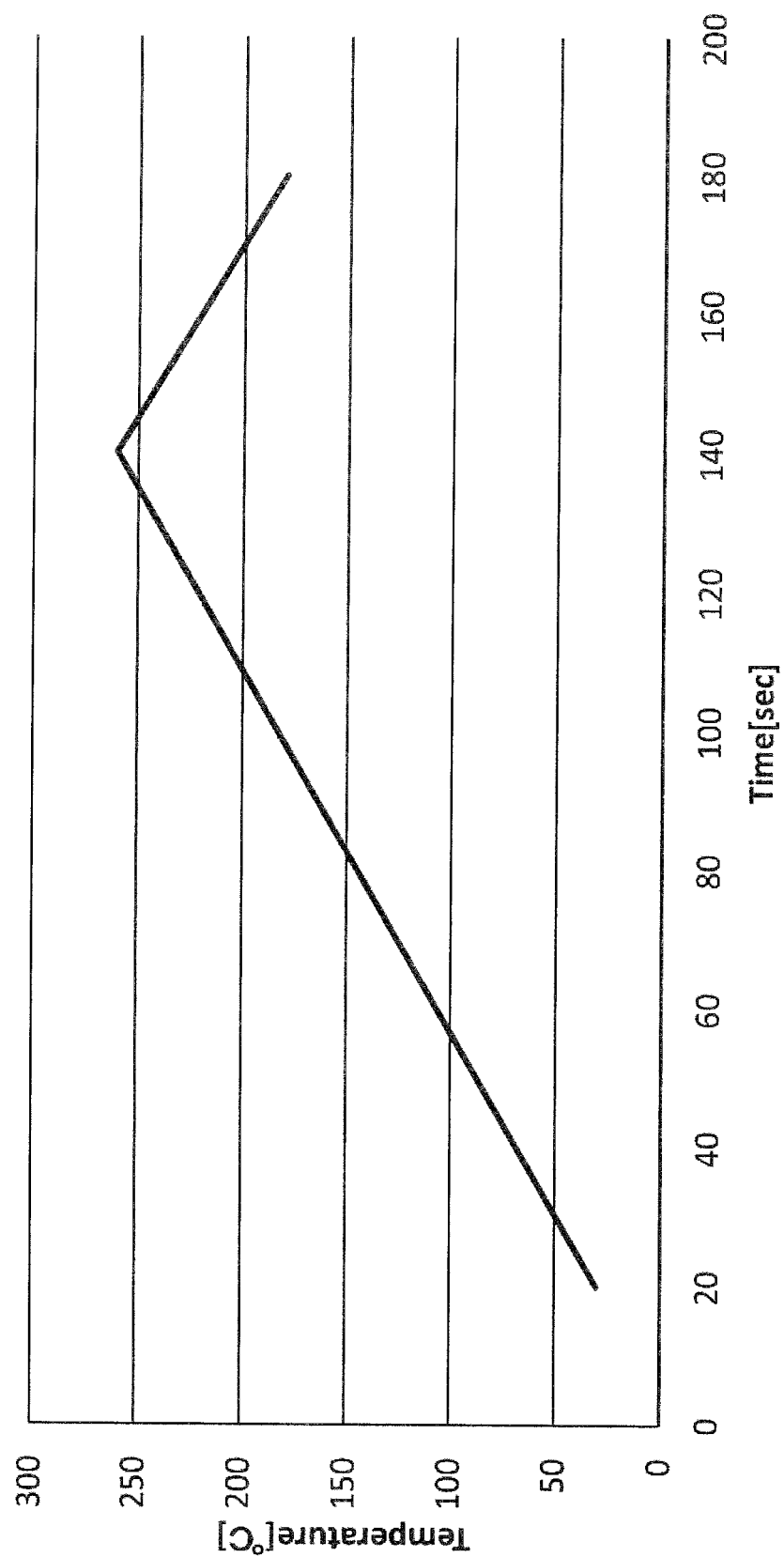
FIG. 1 illustrates a temperature profile in a void test and a missing bump test on solder pastes according to Examples and Comparative Examples, and in a viscosity measurement after heating (reflowing) of fluxes according to the embodiment, Examples, and Comparative Examples.

The embodiment(s) will now be described with reference to the accompanying drawings, wherein like reference numerals designate corresponding or identical elements throughout the various drawings.

One embodiment of the flux and solder paste of the present invention will be described below in detail.

The present invention will not be limited to the embodiment.

1. Flux

The flux according to the present embodiment includes a rosin resin, an activator, a thixotropic agent, and a solvent.

Examples of the rosin resin include rosin such as tall oil rosin, gum rosin, and wood rosin; and rosin derivatives such as hydrogenated rosin, polymerized rosin, unhomogenized rosin, acrylic modified rosin, maleic modified rosin, and formylated rosin.

Among these rosin resins, those having a softening point of 100° C. or lower are preferably used. By using rosin resins having a low softening point, flowability of the flux can be improved during heating (reflowing), which allows a solder alloy powder to easily precipitate and thereby suppressing effect of the occurrence of missing bumps is improved.

The loading of the rosin resin is preferably 25% by mass or more and 50% by mass or less, and more preferably 30% by mass or more and 40% by mass or less with reference to the total amount of the flux.

Examples of the activator include amine salts such as hydrohalide salts of organic amines (inorganic acid salts and organic acid salts), organic acids, organic acid salts, organic amine salts, and brominated halogen compounds. Specific examples include diethylamine salts, acid salts, succinic acid, adipic acid, sebacic acid, glutaric acid, diphenylguanidine hydrobromide, cyclohexyl amine hydrobromide, brominated triallyl isocyanurate, tris(2,3-dibromopropyl)isocyanurate, and poly-8,13-dimethyl-8,12-eicosadienedioic acid anhydride. Among them, poly-8,13-dimethyl-8,12-eicosadienedioic acid anhydride is preferably used as the activator. Poly-8,13-dimethyl-8,12-eicosadienedioic acid anhydride is in a liquid state at normal temperature and with excellent stability under high temperature because of long chain compound, and thereby suppressing effect of void occurrence and missing bump is improved.

They may be used alone or in combination of two or more.

The loading of the activator depends on the other component and the lead-free solder alloy to be used, but is commonly 20% by mass or less with reference to the total amount of the flux.

Examples of the thixotropic agent include hydrogenated castor oil, bisamide thixotropic agents (saturated fatty acid bisamide, unsaturated fatty acid bisamides, and aromatic bisamides), and dimethyldibenzylidene sorbitol. Among them, hydrogenated castor oil is particularly preferably used as the thixotropic agent. In comparison with other thixotropic agents, hydrogenated castor oil has low softening point, which allows flowability of the flux to be improved during heating (reflowing). Thus, a solder alloy powder can be easily precipitated and thereby suppressing effect of the occurrence of missing bumps is improved.

They may be used alone or in combination of two or more.

The loading of the thixotropic agent is preferably 3% by mass or more and 10% by mass or less, and more preferably 5% by mass or more and 8% by mass or less with reference to the total amount of the flux.

Examples of the solvent include alcohol-based, ethanol-based, acetone-based, toluene-based, xylene-based, ethyl acetate-based, ethyl cellosolve-based, butyl cellosolve-based, glycol ether-based, and ester-based ones. They may be used alone or in combination of two or more.

The flux according to the present embodiment preferably include, as the solvent, a monovalent alcohol having 18 or more and 24 or less carbon atoms in one molecule.

Such monovalent alcohol is resistant to volatilization even when the heating (reflowing) temperature is high. This reduces the volatilization amount of the solvent during heating (reflowing), and prevents the decrease in flowability of the flux. This hinders inclusion of the flux component in the solder alloy molten by heating (reflowing), and suppresses the occurrence of voids.

Also in the formation of solder bumps, the solder alloy molten on the bottom of the opening during heating (reflowing) easily flows, whereby the occurrence of missing bumps is suppressed. These effects are also achieved in the formation of solder bumps by the dry film process wherein the opening has a greater depth, and the occurrence of missing bumps can be suppressed even in in this process.

Another method for suppressing the decrease in flowability of the flux in heating (reflowing) is the use of an ester solvent having a high boiling point (the volatilization amount at high temperatures is small).

However, such ester solvents are often poorly soluble in other flux components such as an activator and a thixotropic agent. Therefore, these ester solvents have been commonly unuseful as a flux without being combined with other solvent having high solubility and a low boiling point.

However, the flux according to the present embodiment includes a monovalent alcohol having 18 or more and 24 or less carbon atoms in one molecule as the solvent, so that it does not necessarily requires the combination with other solvent having a low boiling point, and suppresses the decrease in flowability of the flux during heating (reflowing) even when used alone. However, combination of the monovalent alcohol and other solvent is not excluded, and they may be combined as necessary.

The carbon atoms contained in one molecule of the monovalent alcohol is preferably 18 or more and 20 or less.

The monovalent alcohol is preferably a branched alcohol or an unsaturated alcohol.

Examples of the monovalent alcohol include oleyl alcohol, isostearyl alcohol, isoeicosanol, 2-octyldodecanol, and 2-decyltetradecanol. Among them, oleyl alcohol, isostearyl alcohol, isoeicosanol, and especially 2-octyldodecanol, are preferably used. They may be used alone or in combination of two or more.

The loading of the solvent is preferably 30% by mass or more and 60% by mass or less, and even more preferably 40% by mass or more and 50% by mass or less with reference to the total amount of the flux.

The loading of the monovalent alcohol is preferably 30% by mass or more and 60% by mass or less, more preferably 35% by mass or more and 55% by mass or less, and even more preferably 40% by mass or more and 50% by mass or less with reference to the total amount of the flux. By keeping the loading of the monovalent alcohol within the aforementioned range, suppressing effect of void occurrence of solder bump is improved.

The flux according to the present embodiment may include an antioxidant for the purpose of preventing oxidation of the solder alloy powder.

Examples of the antioxidant include hindered phenol antioxidants, phenol antioxidants, bisphenol antioxidants, and polymer antioxidants. Among them, hindered phenol antioxidants are particularly preferably used.

The antioxidant will not be limited to them, and the loading is not particularly limited. The loading is commonly about 0.5% by mass to 5% by mass with reference to the total amount of the flux.

The flux according to the present embodiment may further include an additive such as a halogen, a delustering agent, or an anti-foaming agent. The loading of the additive is preferably 10% by mass or less, and even more preferably 5% by mass or less with reference to the total amount of the flux.

The flux according to the present embodiment preferably has a viscosity of 30 Pa·s or less after heating under the reflowing condition in which the temperature is risen from normal temperature to a peak temperature of 260° C. at a temperature rising rate of 2° C./second, and the temperature is decreased at a temperature decreasing rate of 2° C./second after reaching the peak temperature as shown in the temperature profile given in FIG. 1. Also, the viscosity of 25 Pa·s or less is preferable.

In the measurement of the viscosity, firstly, 4 g of the flux according to the present embodiment is placed in an aluminum petri dish, and the petri dish is placed on a gauze, and reflowed using a reflowing apparatus. The reflowing conditions are in accordance with the temperature profile (above reflowing condition) given in FIG. 1.

The flux after reflowing is returned to normal temperature, and its viscosity is measured using an E type viscometer. The viscosity was measured at a rotation speed of 10 rpm and a measurement temperature of 25° C.

2. Solder Paste

The solder paste according to the present embodiment can be prepared by mixing the flux according to the present embodiment and a solder alloy powder by a known method.

Examples of the solder alloy powder include combinations of Sn, Ag, Cu, Bi, Zn, In, Ga, Sb, Au, Pd, Ge, Ni, Cr, Al, P, In, and Pb. The alloy composition of the solder alloy powder is not particularly limited, as long as it will not impair the effect of the solder paste according to the present embodiment.

Typical examples of the solder alloy powder include lead free solder alloy powders such as Sn—Ag solder alloy, Sn—Ag—Cu solder alloy, Sn—Ag—Cu—In solder alloy, and Sn—Cu solder alloy, and lead-containing solder alloy powder may be used.

The loading of the solder alloy powder is preferably from 63% by mass to 93% by mass, more preferably from 84% by mass to 92% by mass, and particularly preferably from 86% by mass to 90% by mass with reference to the total amount of the solder paste.

3. Solder Joint

The solder joint formed using the solder paste according to the present embodiment is formed by, for example, the following method.

More specifically, the solder paste is printed on the substrate in the predetermined position, and an electronic component is mounted on the substrate in the predetermined position, and the object is reflowed, thereby forming the solder joint. The solder joint thus formed causes few void and has high reliability, and thus is suitably used for semiconductors and electronic devices.

4. Solder Bumps

The solder bumps formed using the solder paste according to the present embodiment are formed by, for example, the following method.

Firstly, electrodes and an insulating layer having a certain pattern are formed on a substrate. The insulating layer may be made by any method as long as it forms a layer including an insulating component and having a certain film thickness, such as a liquid solder resist or a dry film.

Subsequently, a metal mask corresponding to the pattern (the above of the electrodes is open) is placed on the substrate so as to be in contact with the insulating layer, and the solder paste is printed using a squeegee or the like so as to be charged into the open region on the electrodes. Thereafter, the substrate is placed in a reflowing apparatus, and reflowed according to a certain temperature profile. After reflowing, the flux component (flux residue) is removed from the substrate, thereby forming solder bumps.

The solder paste according to the present embodiment may form solder bumps by a dry film process. The method for forming solder bumps by the dry film process is, for example, as follows.

Firstly, an electrode part and an insulating layer having a certain pattern are formed on a substrate. The method for making the insulating layer is not particularly limited as long as it forms a layer including an insulating component and having a certain film thickness, such as a liquid solder resist or a dry film.

Subsequently, a dry film layer is formed on the insulating layer. The dry film layer is formed by attaching a dry film to the substrate in a certain range so as to be in contact with the insulating layer, and subjecting the object to exposure and development according to a certain pattern. More specifically, the exposure and development operations remove the resist component of the dry film in the area where solder bumps are formed (on the electrodes), and a dry film layer having a certain pattern is formed on the substrate. As a result of this, a region surrounded by the dry film layer (opening) is formed.

Then, printing is carried out in such a manner that the solder paste is charged into the opening using a squeegee or the like. Thereafter, the substrate is place in a reflowing apparatus, and reflowed according to a certain temperature profile. After the reflowing, the flux component (flux residue) and the dry film layer remaining on the substrate are removed, thereby forming solder bumps.

The solder bumps thus formed suppresses the decrease in flowability of the flux during reflowing of the solder paste, which suppresses the occurrence of voids in the solder bumps, and also suppresses the occurrence of missing bumps during solder bump formation.

EXAMPLES

The present embodiment will be described below in detail with reference to Examples and Comparative Examples. The present invention will not be limited to these examples.

Making of Flux

The components were mixed according to the composition and recipe given in Table 1, thus making the fluxes according to Examples 1 to 8 and Comparative Examples 1 to 7. In Table 1, the unit of the values concerning the compositions is % by mass, unless otherwise specified.

Subsequently, 12% by mass of the flux according to Examples 1 to 8 and Comparative Examples 1 to 7 and 88% by mass of the Sn-3Ag-0.5Cu solder alloy powder (powder particle size from 2 μm to 8 μm: IPC standard Type 8) are mixed, thereby obtaining the solder paste according to Examples 1 to 8 and Comparative Examples 1 to 7.

<Weight Reduction Rate>

The solvent components were measured for the weight reduction rate at 220° C.

The weight reduction rate was measured under the following conditions. More specifically, the weight reduction rate after heating 10 mg of the sample to 220° C. at a

TABLE 1

| | | Example 1 | Example 2 | Example 3 | Example 4 | Example 5 | Example 6 | Example 7 | Example 8 | Comparative Example 1 |
|---|---|---|---|---|---|---|---|---|---|---|
| Rosin resin | FORAL AX *1 | 16 | 16 | 16 | 16 | 16 | 16 | 16 | 13.5 | 16 |
| | HARITACK FG-90 *2 | 16 | 16 | 16 | 16 | 16 | 16 | 16 | 13.5 | 16 |
| Activator | Taic-6B *3 | 1 | 1 | 1 | 1 | 1 | 1 | 1 | 1 | 1 |
| | Glutaric acid | 1 | 1 | 1 | 1 | 1 | 1 | 1 | 1 | 1 |
| | IPU-22AH *4 | 9 | 4 | 9 | 9 | 9 | 9 | 14 | 4 | 9 |
| Thixotropic agent | Hydrogenated castor oil | 7 | 7 | 7 | 7 | 7 | 7 | 7 | 7 | 7 |
| Solvent | NJCOL 240A *5 | 50 | | | | | | | | |
| | NJCOL 200A *6 | | 40 | 50 | | | | | | |
| | FINEOXOCOL 2000 *7 | | | | 50 | | | | | |
| | Isostearyl Alcohol EX *8 | | | | | 50 | | 30 | 60 | |
| | Oleyl alcohol (carbon atoms 18: unsaturated) | | | | | | 50 | | | |
| | NJCOL 160BR *9 | | | | | | | | | |
| | Isotridecanol (carbon atoms 13: branched) | | | | | | | | | |
| | 2-ethylhexyl diglycol | | 15 | | | | | 15 | | |
| | Octanediol | | | | | | | | | |
| | DOS *10 | | | | | | | | | 50 |

| | | Comparative Example 2 | Comparative Example 3 | Comparative Example 4 | Comparative Example 5 | Comparative Example 6 | Comparative Example 7 |
|---|---|---|---|---|---|---|---|
| Rosin resin | FORAL AX *1 | 16 | 16 | 16 | 16 | 11 | 16 |
| | HARITACK FG-90 *2 | 16 | 16 | 16 | 16 | 11 | 16 |
| Activator | Taic-6B *3 | 1 | 1 | 1 | 1 | 1 | 1 |
| | Glutaric acid | 1 | 1 | 1 | 1 | 1 | 1 |
| | IPU-22AH *4 | 9 | 9 | 9 | 14 | 4 | 9 |
| Thixotropic agent | Hydrogenated castor oil | 7 | 7 | 7 | 7 | 7 | 7 |
| Solvent | NJCOL 240A *5 | | | | | | |
| | NJCOL 200A *6 | | | | | | |
| | FINEOXOCOL 2000 *7 | | | | | | |
| | Isostearyl Alcohol EX *8 | | | | | 25 | 65 |
| | Oleyl alcohol (carbon atoms 18: unsaturated) | | | | | | |
| | NJCOL 160BR *9 | 50 | | | | | |
| | Isotridecanol (carbon atoms 13: branched) | | 50 | | | | |
| | 2-ethylhexyl diglycol | | | | 50 | 20 | |
| | Octanediol | | | | | | |
| | DOS *10 | | | 50 | | | |

*1: fully hydrogenated modified rosin (softening point 80° C.) Eastman Chemical Company NYSE
*2: formylated rosin (softening point 85 to 95° C.) Harima Chemicals Inc.
*3: tris(2,3-dibromopropyl) isocyanurate, Nippon Kasei Chemical Co., Ltd.
*4: poly-8,13-dimethyl-8,12-eicosadienedioic acid anhydride, Okamura Oil Mill, Ltd.
*5: 2-decyltetradecanol (carbon atoms 24: branched), New Japan Chemical Co., Ltd.
*6: 2-octyldodecanol (carbon atoms 20: branched), New Japan Chemical Co., Ltd.
*7: isoeicosanol (carbon atoms 20: branched), Nissan Chemical Industries, Ltd.
*8: isostearyl alcohol (carbon atoms 18: branched), KOKYU ALCOHOL KOGYO CO., LTD.
*9: 2-hexyldecanol (carbon atoms 16: branched), New Japan Chemical Co., Ltd.
*10: bis(2-ethylhexyl) sebacate, DAIHACHI CHEMICAL INDUSTRY CO., LTD.

temperature rising rate of 10° C./min in an N₂ (300 mL/min) atmosphere using a thermogravimetry/differential thermal analyzer (product name: STA7200RV, Hitachi, High-Technologies Corporation) was measured. The results are given in Table 2.

TABLE 2

| Solvent | Weight reduction rate (%) |
|---|---|
| NJCOL 240A | −2 |
| NJCOL 200A | −7 |
| FINEOXOCOL 2000 | −17 |
| Isostearyl Alcohol EX | −15 |
| Oleyl alcohol (carbon atoms 18: unsaturated) | −11 |
| NJCOL 160BR | −32 |
| Isotridecanol (carbon atoms 13: branched) | −100 |
| 2-ethylhexyl diglycol | −100 |
| DOS | −1 |
| Octanediol | −100 |

<Void Test>

Figure 2:
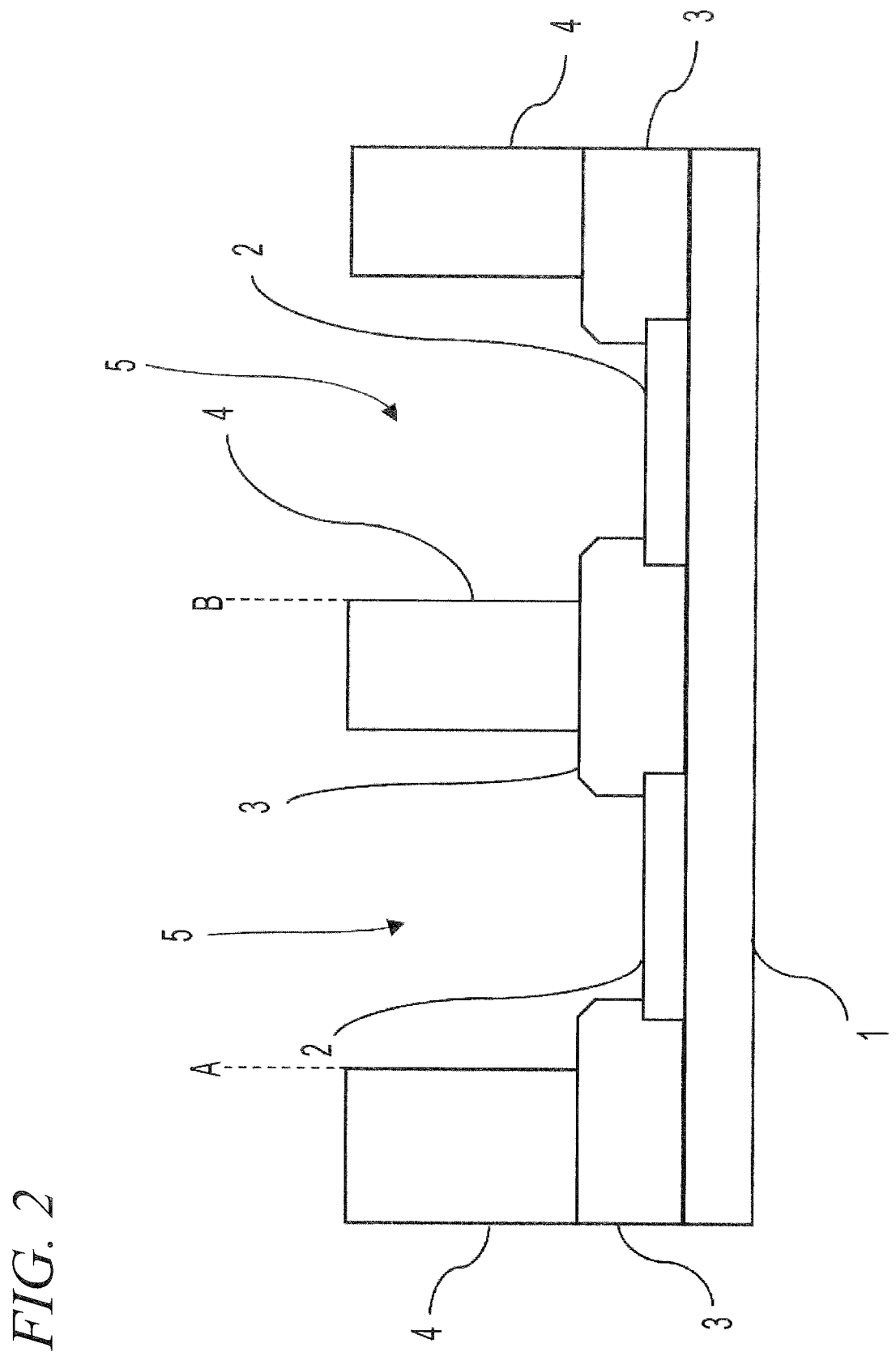
FIG. 2 is a schematic view of a substrate for forming solder bumps in the void test and the missing bump test of the solder paste according to Examples and Comparative Examples.

As illustrated in FIG. 2, electrodes 2, an insulating layer 3, a dry film layer 4, and an opening 5 are formed on a substrate 1. The substrate 1 having this structure is made by, for example, the following method.

Firstly, the electrodes 2 and the insulating layer 3 having a certain pattern were formed on the substrate 1 (size: 250 mm×75 mm). The insulating layer 3 may be made by any method as long as it forms a layer including an insulating component and having a certain film thickness, such as a liquid solder resist or a dry film. The diameter of the opening in the surface (top surface) of the insulating layer 3 was 85 μm.

Subsequently, the dry film layer 4 was formed on the insulating layer 3. The dry film layer 4 was formed by attaching a dry film (product name: WB-5040, Du Pont K.K.) to the substrate 1 in a certain range so as to be in contact with the insulating layer 3, and subjecting the object to exposure and development according to a certain pattern. More specifically, the exposure and development removed the portion of the resist component where solder bumps were to be formed (on the electrodes 2) on the dry film, thereby forming the dry film layer 4 having a certain pattern on the substrate 1. The height (thickness) of the dry film layer 4 was 38 μm and the width was 35 μm, the diameter of the opening in the surface (top surface) of the dry film layer 4 was 115 μm, and the pitch width (the distance from A to B in FIG. 2) was 150 μm. As a result of this, a region (opening 5) surrounded by the dry film layer 4 was formed.

Subsequently, using a urethane squeegee, the solder pastes according to Examples 1 to 8 and Comparative Examples 1 to 7 were printed on each of the substrates 1 so as to be charged into the opening 5. The number of printing was ten times in one direction.

Thereafter, the substrates 1 having the solder pastes printed thereon were placed in a reflowing apparatus (product name: TNP25-538EM, TAMURA Corporation), and reflowed according to the temperature profile given in FIG. 1 in a nitrogen atmosphere (oxygen concentration: 100 ppm or less) without preheating, at a peak temperature of 260° C. and a temperature rising rate and a temperature decreasing rate of 2° C./second. After the reflowing, the remaining portion of the flux component on each of the substrate 1 (flux residue) and the dry film layer 4 were removed, thereby forming solder bumps.

Subsequently, a flux (product name: BF-30, TAMURA Corporation) was applied to the solder bumps thus formed, reflowing was carried out under the same reflowing conditions as that for forming the solder bumps, thereby making the test substrates. The dry film layer 4 was removed using a peeling solution (product name: CLEANTHROUGH A-04: Kao Corporation) and by giving vibration for one minute using an ultrasonic cleaning apparatus (product name: ASU-3M, AS ONE Corporation). The number of pad provided on each of the substrate 1 was 7,200.

For the test substrates thus made, about 500 solder bumps were visually observed for voids using an X ray observation apparatus (product name: XD7600 Diamond, Nordson Dage), and measured for the maximum void diameter (%) and the average void diameter (%) occurred in these solder bumps, and the proportion of the solder bumps wherein those having a void diameter rate of 10% or more occurred (void occurrence rate (%)), and evaluated based on the following criteria. The results are given in Table 3.

Maximum void diameter (%)

⊚: Maximum void diameter is 0% or more and 20% or less

○: Maximum void diameter is more than 20% and 25% or less

Δ: Maximum void diameter is more than 25% and 30% or less

×: maximum void diameter is more than 30%

Average void diameter (%)

○: Average void diameter is 0% or more and 15% or less

Δ: Average void diameter is more than 15%

Void occurrence rate (%)

⊚⊚: Void occurrence rate is 0% or more 25% or less

⊚: Void occurrence rate is more than 25% and 35% or less

○: Void occurrence rate is more than 35% and 45% or less

Δ: Void occurrence rate is more than 45% and 50% or less

×: void occurrence rate is more than 50%

<Missing Bump Test>

Each test substrate was made under the same conditions as the void test.

Each study substrate was measured for the number of solder bumps which caused missing bumps, and evaluated based on the following criteria. The results are given in Table 3.

○: No missing bump (no occurrence)

×: missing bumps occurred

<Viscosity of Flux after Reflowing>

In the measurement of the viscosity, 4 g portions of the fluxes according to Examples 1 to 8 and Comparative Examples 1 to 7 was individually placed in aluminum petri dishes, and the petri dishes were place on a gauze, and reflowed using an reflowing apparatus (product name: TNP25-538EM, TAMURA Corporation). The reflowing conditions followed the temperature profile given in FIG. 1.

Each flux after reflowing was returned to normal temperature, and measured using an E type viscometer (product name: RE150U, Toki Sangyo Co., Ltd.). The viscosity was measured at a rotation speed of 10 rpm and a measurement temperature of 25° C. The viscosity thus measured was evaluated based on the following criteria. The results are given in Table 3.

⊚: 15 Pa·s or less

○: More than 15 Pa·s and 25 Pa·s or less

Δ: More than 25 Pa·s and 30 Pa·s or less

×: more than 30 Pa·s

TABLE 3

| | Example 1 | Example 2 | Example 3 | Example 4 | Example 5 | Example 6 | Example 7 | Example 8 | Comparative Example 1 |
|---|---|---|---|---|---|---|---|---|---|
| Maximum void diameter (%) | ○ | ⊙ | ⊙ | ⊙ | ⊙ | ○ | ○ | ⊙ | Unmeasurable |
| Average void diameter (%) | ○ | ○ | ○ | ○ | ○ | ○ | ○ | ○ | |
| Void occurrence rate (%) | Δ | ⊙⊙ | ⊙⊙ | ⊙ | ○ | ○ | Δ | Δ | |
| Number of occurrence of missing bumps | ○ | ○ | ○ | ○ | ○ | ○ | ○ | ○ | |
| Flux viscosity (Pa · s) after reflow heating | ⊙ | ⊙ | ⊙ | ○ | ⊙ | ⊙ | ○ | ⊙ | |

| | Comparative Example 2 | Comparative Example 3 | Comparative Example 4 | Comparative Example 5 | Comparative Example 6 | Comparative Example 7 |
|---|---|---|---|---|---|---|
| Maximum void diameter (%) | Δ | ○ | Δ | ○ | ○ | X |
| Average void diameter (%) | ○ | ○ | ○ | ○ | ○ | ⊙ |
| Void occurrence rate (%) | X | X | X | X | X | X |
| Number of occurrence of missing bumps | ○ | X | X | ○ | ○ | X |
| Flux viscosity (Pa · s) after reflow heating | Δ | X | X | Δ | ⊙ | X |

As described above, the solder bumps formed using the solder paste according to Examples achieved good results in the void test (maximum void diameter, average void diameter, and void occurrence rate), indicating that they favorably suppressed the occurrence of missing bumps. Especially, the carbon atoms contained one molecule is 18 or more and 24 or less, and, above all, in Examples 2 to 6 wherein the loading of the monovalent alcohol having carbon atoms of 18 or more and 20 or less in one molecule is 40% by mass or more and 50% by mass or less, it is indicated that the suppressing effect of void occurrence can be improved.

On the other hand, Comparative Example 1 using the ester solvent having a low weight reduction rate at 220° C. was unuseful as a flux, because the other flux components did not thoroughly dissolve. Thus, for Comparative Examples 1, the results of each tests are given as "unmeasurable" since a flux and a solder paste were not able to be prepared.

Comparative Examples 2 to 4 and 7 using a solvent other than the monovalent alcohol having 18 or more and 24 or less carbon atoms in one molecule poorly suppressed the decrease in flowability during reflowing, so that their void occurrence rates in solder bumps were more than 50%, and the results in the other void test and/or missing bump test were inferior to those of the solder pastes according to Examples.

Furthermore, the void occurrence rates were more than 50% in Comparative Example 5 and Comparative Example 6 wherein the loadings of the monovalent alcohol having carbon atoms of 18 or more and 24 or less in one molecule were less than 30% by mass and more than 60% by mass, respectively, with reference to the total amount of the flux.

The present invention has the following structure for achieving the above-mentioned object.

(1) A flux according to the present embodiment includes a rosin resin, an activator, a thixotropic agent, and a solvent, wherein the solvent is a monovalent alcohol having 18 or more and 24 or less of carbon atoms in one molecule, and the loading of the monovalent alcohol is 30% by mass or more and 60% by mass or less with reference to the total amount of the flux.

(2) According to the configuration of the above (1), the carbon atoms contained in one molecule of the monovalent alcohol is 18 or more and 20 or less.

(3) According to the configuration of the above (1) or (2), the monovalent alcohol is a branched alcohol or an unsaturated alcohol.

(4) According to the configuration of any one of the above (1) to (3), wherein the monovalent alcohol is selected from at least one of oleyl alcohol, isostearyl alcohol, isoeicosanol, 2-octyldodecanol, or 2-decyltetradecanol.

(5) According to the configuration of any one of the above (1) to (4), the flux has a viscosity of 30 Pa·s or less after being heated under the reflowing condition in which the temperature is risen from normal temperature to a peak temperature of 260° C. at a temperature rising rate of 2° C./second, and the temperature is decreased at a temperature decreasing rate of 2° C./second after reaching the peak temperature.

(6) A solder paste according to the present embodiment includes the flux according to any one of the above (1) to (5), and a solder alloy powder.

(7) A method for forming a solder bump includes forming an electrode and a first insulating layer on a substrate, forming a second insulating layer on the first layer such that an opening is formed on the electrode, printing such that the opening on the electrode is filled with the solder paste according to the above (6), heating the substrate, on which the opening on the electrode is filled with the solder paste, to form a flux residue, and forming the solder bump by removing the flux residue and the second insulating layer.

The flux and the solder paste using the same of the present embodiment suppress the occurrence of voids in solder joints and solder bumps to be formed, and suppress the occurrence of missing bumps during formation of the solder bumps by suppressing the decrease in flowability of the flux during reflowing of the solder paste.

Obviously, numerous modifications and variations of the present invention are possible in light of the above teachings. It is therefore to be understood that within the scope of the appended claims, the invention may be practiced otherwise than as specifically described herein.

What is claimed is:

1. A flux comprising:
a rosin resin;
an activator;
a thixotropic agent; and
a solvent including 30% by mass or more and 60% by mass or less monovalent alcohol with respect to a total mass amount of the flux, the monovalent alcohol having 18 or more and 24 or less of carbon atoms in one molecule,
wherein the activator contains a poly-8,13-dimethyl-8,12-eicosadienedioic acid anhydride.

2. The flux according to claim 1, wherein the monovalent alcohol is at least one selected from the group consisting of oleyl alcohol, isostearyl alcohol, isoeicosanol, 2-octyldodecanol, and 2-decyltetradecanol.

3. The flux according to claim 1, wherein a viscosity of the flux is 30 Pa·s or less after the flux is heated under a reflow condition in which the temperature is risen to a peak temperature of 260° C. at a temperature-rising rate of 2° C./second and then the temperature is decreased at a temperature-decreasing rate of 2° C./second.

4. The flux according to claim 1, wherein the monovalent alcohol is a branched alcohol or an unsaturated alcohol.

5. The flux according to claim 4, wherein the monovalent alcohol is at least one selected from the group consisting of oleyl alcohol, isostearyl alcohol, isoeicosanol, 2-octyldodecanol, and 2-decyltetradecanol.

6. The flux according to claim 1, wherein the carbon atoms contained in the one molecule of the monovalent alcohol is 18 or more and 20 or less.

7. The flux according to claim 6, wherein the monovalent alcohol is at least one selected from the group consisting of oleyl alcohol, isostearyl alcohol, isoeicosanol, 2-octyldodecanol, and 2-decyltetradecanol.

8. The flux according to claim 6, wherein the monovalent alcohol is a branched alcohol or an unsaturated alcohol.

9. The flux according to claim 8, wherein the monovalent alcohol is at least one selected from the group consisting of oleyl alcohol, isostearyl alcohol, isoeicosanol, 2-octyldodecanol, and 2-decyltetradecanol.

10. The flux according to claim 9, wherein a viscosity of the flux is 30 Pa·s or less after the flux is heated under a reflow condition in which the temperature is risen to a peak temperature of 260° C. at a temperature-rising rate of 2° C./second and then the temperature is decreased at a temperature-decreasing rate of 2° C./second.

11. A solder paste comprising:
a solder alloy powder; and
a flux comprising:
a rosin resin;
an activator;
a thixotropic agent; and
a solvent including 30% by mass or more and 60% by mass or less monovalent alcohol with respect to a total mass amount of the flux, the monovalent alcohol having 18 or more and 24 or less of carbon atoms in one molecule,
wherein the activator contains a poly-8,13-dimethyl-8,12-eicosadienedioic acid anhydride.

12. The solder paste according to claim 11, wherein the monovalent alcohol is at least one selected from the group consisting of oleyl alcohol, isostearyl alcohol, isoeicosanol, 2-octyldodecanol, and 2-decyltetradecanol.

13. The solder paste according to claim 11, wherein the monovalent alcohol is a branched alcohol or an unsaturated alcohol.

14. The solder paste according to claim 13, wherein the monovalent alcohol is at least one selected from the group consisting of oleyl alcohol, isostearyl alcohol, isoeicosanol, 2-octyldodecanol, and 2-decyltetradecanol.

15. The solder paste according to claim 11, wherein the carbon atoms contained in the one molecule of the monovalent alcohol is 18 or more and 20 or less.

16. The solder paste according to claim 15, wherein the monovalent alcohol is at least one selected from the group consisting of oleyl alcohol, isostearyl alcohol, isoeicosanol, 2-octyldodecanol, and 2-decyltetradecanol.

17. The solder paste according to claim 15, wherein the monovalent alcohol is a branched alcohol or an unsaturated alcohol.

18. The solder paste according to claim 17, wherein the monovalent alcohol is at least one selected from the group consisting of oleyl alcohol, isostearyl alcohol, isoeicosanol, 2-octyldodecanol, and 2-decyltetradecanol.

19. A method for forming a solder bump, comprising:
providing an electrode and a first insulating layer on a substrate;
providing a second insulating layer on the first insulating layer such that an opening is provided on the electrode;
filling the opening with a solder paste including a solder alloy powder and a flux, the flux including a rosin resin, an activator, a thixotropic agent, and a solvent, the solvent including 30% by mass or more and 60% by mass or less monovalent alcohol with respect to a total mass amount of the flux, the monovalent alcohol having 18 or more and 24 or less of carbon atoms in one molecule, wherein the activator contains a poly-8,13-dimethyl-8,12-eicosadienedioic acid anhydride;
heating the substrate to form a flux residue after the opening is filled with the solder paste; and removing the flux residue and the second insulating layer to form the solder bump.

20. The method according to claim 19, wherein the monovalent alcohol is at least one selected from the group consisting of oleyl alcohol, isostearyl alcohol, isoeicosanol, 2-octyldodecanol, and 2-decyltetradecanol.

* * * * *